(12) United States Patent
Sharon et al.

(10) Patent No.: US 9,811,418 B2
(45) Date of Patent: Nov. 7, 2017

(54) SYNDROME-BASED CODEWORD DECODING

(71) Applicant: SANDISK TECHNOLOGIES INC., Plano, TX (US)

(72) Inventors: Eran Sharon, Rishon Lezion (IL); Ariel Navon, Revava (IL)

(73) Assignee: SanDisk Technologies LLC, Plano, TX (US)

( * ) Notice: Subject to any disclaimer, the term of this patent is extended or adjusted under 35 U.S.C. 154(b) by 90 days.

(21) Appl. No.: 14/922,912

(22) Filed: Oct. 26, 2015

(65) Prior Publication Data

US 2017/0116078 A1    Apr. 27, 2017

(51) Int. Cl.
*G11C 29/00* (2006.01)
*G06F 11/10* (2006.01)
*H03M 13/11* (2006.01)
*G06F 3/06* (2006.01)

(52) U.S. Cl.
CPC .......... *G06F 11/1076* (2013.01); *G06F 3/064* (2013.01); *G06F 3/0619* (2013.01); *G06F 3/0673* (2013.01); *G06F 3/0679* (2013.01); *H03M 13/1102* (2013.01)

(58) Field of Classification Search
CPC .. H03M 13/09; H03M 13/1111; H03M 13/27; H03M 13/6331; H03M 13/1128; G11B 20/18; G11B 2020/185; G11B 20/1833
See application file for complete search history.

(56) References Cited

U.S. PATENT DOCUMENTS

| | | | |
|---|---|---|---|
| 4,555,784 A | 11/1985 | Wood | |
| 8,245,102 B1 * | 8/2012 | Cory | H03M 13/19 714/753 |
| 8,929,009 B2 | 1/2015 | Yang et al. | |
| 2004/0153902 A1 * | 8/2004 | Machado | G06F 11/1068 714/710 |
| 2011/0264981 A1 * | 10/2011 | Alrod | H03M 13/3707 714/752 |
| 2014/0168811 A1 * | 6/2014 | Yang | G11B 20/18 360/53 |

* cited by examiner

*Primary Examiner* — Guy Lamarre
(74) *Attorney, Agent, or Firm* — Toler Law Group, PC

(57) ABSTRACT

A device includes a memory device coupled to an error correction code (ECC) decoder. The ECC decoder is configured to generate syndromes corresponding to a representation of a codeword received from the memory device and to perform a single decoding operation on a representation of data included in the representation of the codeword. The single decoding operation is configured to change at least one bit of the representation of the data based on a majority value of a group of the syndromes that are associated with the bit.

20 Claims, 6 Drawing Sheets

SYNDROME-BASED CODEWORD DECODING

FIELD OF THE DISCLOSURE

The present disclosure is generally related to electronic devices and more particularly to syndrome-based codeword decoding.

BACKGROUND

Storage devices enable users to store and retrieve data. For example, some storage devices include non-volatile memory devices used to store data. These storage devices often also include a controller that performs operations such as coordinating access to the non-volatile memory and error detection/correction. For example, the controller may include an error correction code (ECC) engine. The ECC engine may encode the data by generating a codeword including the data and parity data. The controller may store the codeword in the non-volatile memory. The controller may perform a memory operation based on the data. During the memory operation, the controller may receive a representation of the codeword from the non-volatile memory. The representation of the codeword may differ from the codeword due to one or more bit errors. After receiving the representation of the codeword, the controller may perform multiple decoding operations, such as multiple iterations of an iterative decoding process, on the representation of the codeword until all errors in the representation of the codeword have been corrected. Performing multiple decoding operations may add latency to performance of the memory operation.

DETAILED DESCRIPTION

Figure 1:
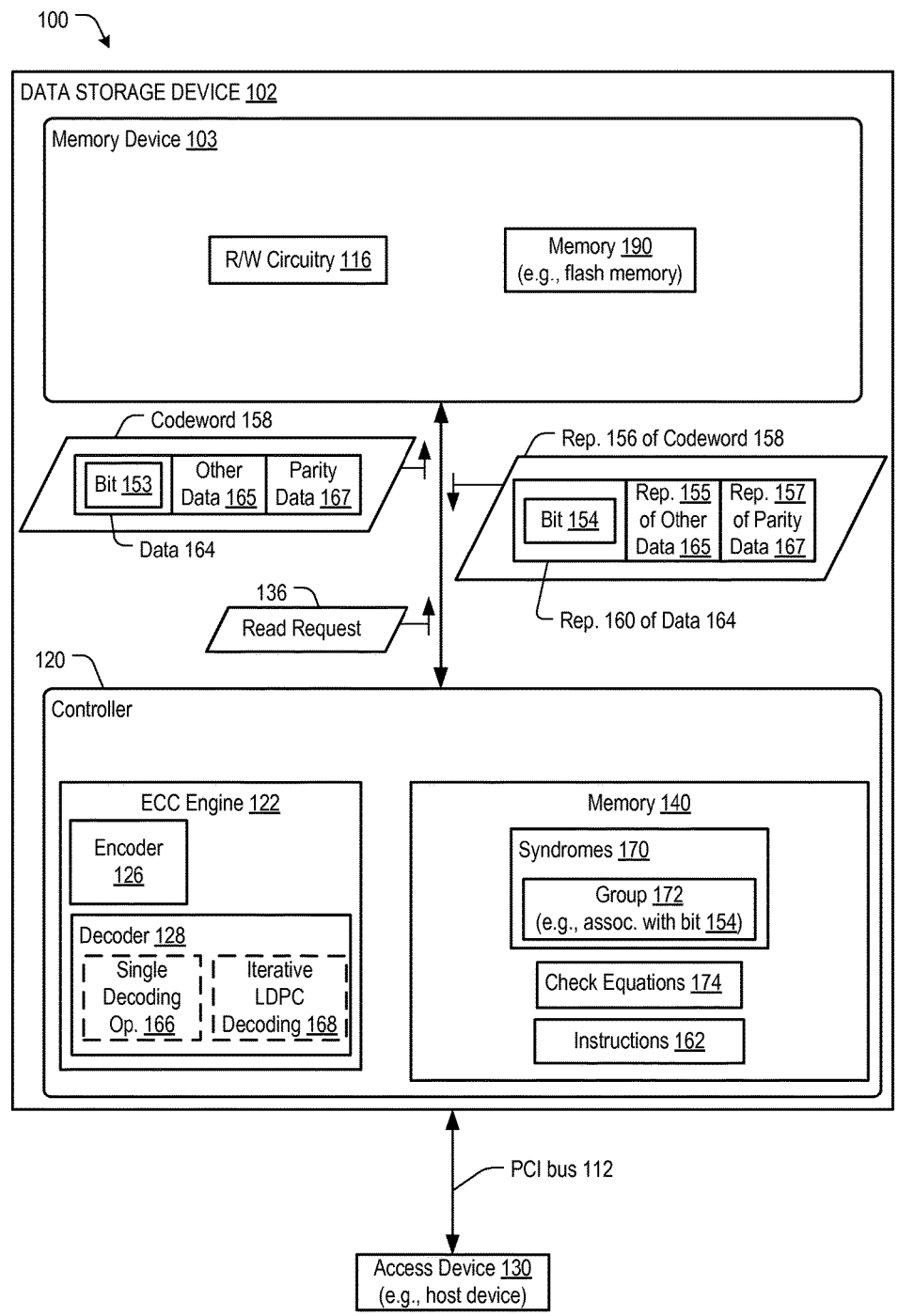
FIG. 1 is a diagram of a particular illustrative example of a system that includes a device, such as a data storage device.

In some implementations, an access device (such as a host device) may be coupled to or have access to a data storage device. For example, the data storage device may include a non-volatile memory, and the access device may use the data storage device to store user data or other data. The data storage device may also include a controller. An ECC engine of the controller may encode data by generating a codeword that includes the data and parity data. The parity data may be generated by applying a plurality of check equations to the data. For example, the ECC engine may generate a parity bit of the parity data by applying a particular check equation to two or more bits of the data. The particular check equation may generate a syndrome having a first value (e.g., 0) when applied to the parity bit and the two or more bits of the data. The controller may provide the codeword to read/write (R/W) circuitry (in the non-volatile memory or coupled to the non-volatile memory) to store the codeword in the non-volatile memory. The data to be stored in the non-volatile memory may include controller data, such as a logical-to-physical mapping table entry, or access device data, such as header data and payload data received from the access device, as illustrative, non-limiting examples.

Bits of the codeword "participate" in parity check equations that are used to generate syndromes during decoding. For example, a parity check equation based on an exclusive-OR (XOR) of bits b1, b2, and b3 of a codeword may be represented as "b1 XOR b2 XOR b3=0". In this example, bits b1, b2 and b3 "participate" in the parity check equation. In some implementations, each bit of a portion of the data may participate in a greater number of check equations than each bit of other portions of the data. For example, at least a first number of parity bits may be generated based on each bit of the portion of the data and fewer than the first number of parity bits may be generated based on each bit of other portions of the data. Having each bit of the portion of the data participate in a greater number of check equations may reduce a likelihood of errors in a representation of the portion of the data after performing a single decoding operation on the representation of the data, such as after completing an initial iteration of an iterative decoding process, as described in further detail below. The portion of the data may therefore be decodable with lower latency than the rest of the data in the codeword. Low-latency decoding of the portion of the data may enhance performance of the data storage device when the portion includes a relatively small amount of data that may be used by the controller independently of the rest of the data in the codeword, such as header data or an entry of a logical-to-physical address mapping table, as illustrative, non-limiting examples.

After storing the codeword to the non-volatile memory, the controller may receive a representation of the codeword from the non-volatile memory responsive to a read request. After receiving the representation of the codeword, the ECC engine may generate syndromes corresponding to the representation of the codeword based on the plurality of check equations. For example, the ECC engine may read each bit of the representation of the codeword and may update one or more corresponding syndromes based on the bit. The ECC engine may perform a single decoding operation on the representation of the data based on the syndromes. For example, the single decoding operation may include a single iteration of a "bit-flipping" process that is performed on the representation of the codeword. The single iteration may include determining, for each bit in the representation of the codeword, whether to change the value of the bit based on a majority value (e.g., 1) of a group of the syndromes that are associated with the bit. The single decoding operation may terminate upon completion of evaluating each bit of the representation of the codeword. After processing each bit in the representation of the codeword, the single decoding operation terminates independently of whether any errors remain in the representation of the codeword.

After completion of the single decoding operation (e.g., each bit of the representation of the codeword has been evaluated and selectively changed based on the syndromes associated with the bit), the portion of the data may have a relatively high likelihood to be error-free and may be available for use by the controller, while the remainder of the data may have a lower likelihood to be error-free. In an implementation where the remainder of the data is to be error-corrected, the ECC engine may determine whether any of the parity check equations are unsatisfied to determine whether the single decoding operation successfully decoded the entire codeword. If any of the parity check equations are unsatisfied, the ECC engine may initiate another decoding operation, such as an iterative low-density parity check (LDPC) decoding operation, on the representation of the codeword. During the iterative LDPC, the ECC engine may update the syndromes based on updated bits of the representation of the codeword, until each of the syndromes has the first value (e.g., 0), or until the decoding fails. Each of the syndromes having the first value (e.g., 0) may indicate that the representation of the data corresponds to the data.

Particular aspects of the disclosure are described below with reference to the drawings. In the description, common or similar features or components may be designated by common reference numbers. As used herein, "exemplary" may indicate an example, an implementation, and/or an aspect, and should not be construed as indicating a preference or a preferred implementation.

Referring to FIG. 1, a particular illustrative example of a system is depicted and generally designated 100. The system 100 includes a data storage device 102 and an access device 130 (e.g., a host device, a test device, a computing device, or a combination thereof). The data storage device 102 and the access device 130 may be operationally coupled via a connection (e.g., a bus 112, such as a peripheral component interconnect (PCI) bus or other type of bus). In some implementations, the data storage device 102 corresponds to or includes a solid state drive (SSD) data storage device that is configured to be embedded within the access device 130 or a removable flash memory data storage device that is configured to be removably coupled to the access device 130. In other implementations, the data storage device 102 corresponds to another device, such as an application-specific integrated circuit (ASIC) or a system-on-chip (SoC) device, as illustrative examples.

The data storage device 102 may include a memory device 103 (e.g., a non-volatile memory device). The memory device 103 may include read/write (R/W) circuitry 116 coupled to a memory 190. The memory 190 may include a flash memory (e.g., a NAND flash memory) or a resistive memory, such as a resistive random access memory (ReRAM), as illustrative examples. The memory 190 may have a three-dimensional (3D) memory configuration. As used herein, a 3D memory device may include multiple physical levels of storage elements (instead of having a single physical level of storage elements, as in a planar memory device). As an example, the memory 190 may have a 3D vertical bit line (VBL) configuration. In a particular implementation, the memory 190 is a non-volatile memory having a 3D memory array configuration that is monolithically formed in one or more physical levels of arrays of memory cells having an active area disposed above a silicon substrate. Alternatively, the memory 190 may have another configuration, such as a two-dimensional (2D) memory configuration or a non-monolithic 3D memory configuration (e.g., a stacked die 3D memory configuration).

In some implementations, the system 100, the data storage device 102, the memory device 103, or a combination thereof, may be integrated within a network-accessible data storage system. Examples of network-accessible data storage systems include an enterprise data system, a network-attached storage (NAS) system, or a cloud data storage system, as illustrative examples.

The data storage device 102 may include a controller 120 coupled to the memory device 103. In some implementations, the controller 120 corresponds to a semiconductor die that includes components of the controller 120. The controller 120 may include an ECC engine 122, memory 140 (e.g., random access memory (RAM)), or both. The ECC engine 122 may include an encoder 126 and a decoder 128.

The ECC engine 122, the encoder 126, the decoder 128, or a combination thereof, may be implemented by software (e.g., instructions) executable by a processor (not shown) of the controller 120 to perform operations described herein. Alternatively, the ECC engine 122, the encoder 126, the decoder 128, or a combination thereof, may include hardware (e.g., one or more circuits) configured to perform operations described herein. The encoder 126 may be configured to generate a codeword 158 including data 164 and parity data 167. The decoder 128 may be configured to perform a single decoding operation 166, as described herein. The memory 140 may be configured to store one or more instructions 162. In a particular implementation, the instructions 162, when executed by a processor of the controller 120, enable the processor to perform operations described herein.

Figure 2:
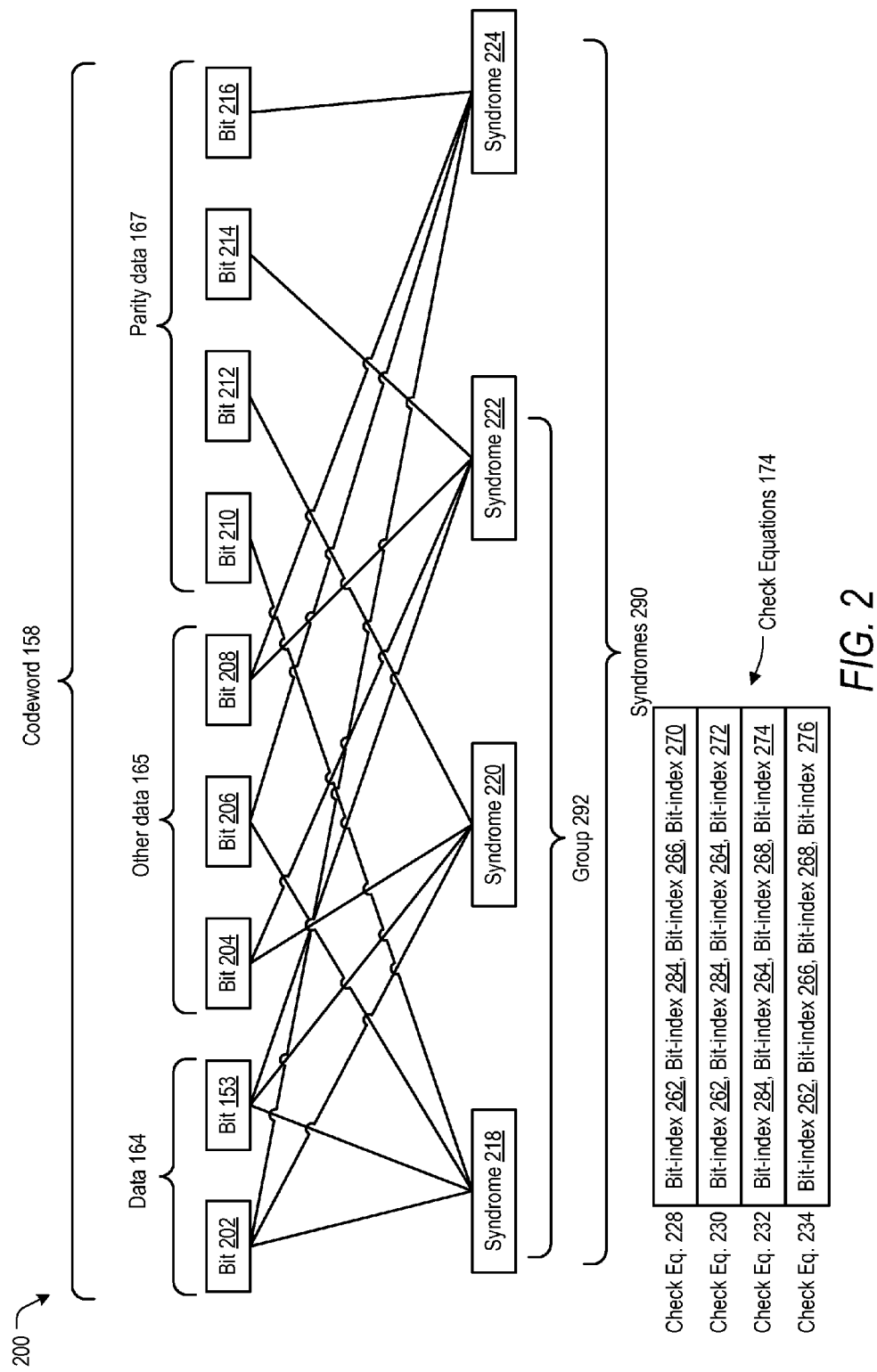
FIG. 2 is a diagram of a particular illustrative example of a codeword that may be generated by the device of FIG. 1.

During operation, the encoder 126 may generate the codeword 158 including the data 164, other data 165, and the parity data 167, such as described further with respect to FIG. 2. In a particular aspect, the data 164 may correspond to a logical-to-physical mapping table entry and the other data 165 may correspond to one or more additional logical-to-physical mapping table entries. In an alternate aspect, a combination of the data 164 and the other data 165 may correspond to a logical-to-physical mapping table entry. In this aspect, the data 164 may correspond to a portion of the logical-to-physical mapping table entry. For example, the portion of the logical-to-physical mapping table entry may indicate a physical address. The encoder 126 may generate the codeword 158 during generation (or update) of a logical-to-physical mapping table.

In a particular aspect, the data 164 may correspond to header data and the other data 165 may correspond to payload data. The encoder 126 may generate the codeword 158 in response to determining receipt of a write request by the controller 120 from the access device 130, as further described with reference to FIG. 5. The write request may include the payload data and may indicate a logical address of the payload data. The controller 120 may generate a logical-to-physical mapping table entry that maps a physical address of the memory 190 to the logical address. The physical address may indicate a location of the memory 190 at which the codeword 158 is to be stored. The controller 120 may generate header data and may include the logical address in the header data.

In a particular aspect, a combination of the data 164 and the other data 165 may correspond to header data. In this aspect, the data 164 may correspond to a portion of the header data. The portion of the header data may indicate information used during garbage collection. The information may include a valid/invalid flag that indicates whether payload data includes valid data, or a counter that indicates a number of times a copy-back operation has been performed to the data of the payload, as illustrative, non-limiting examples. The encoder 126 may generate (or update) the codeword 158 in response to determining that the count of references is to be updated. For example, the encoder 126 may update the codeword 158 in response to allocation (or deallocation) of a pointer to a memory location (e.g., the logical address) corresponding to the codeword 158.

The encoder 126 may generate the codeword 158 based on one or more check equations 174. For example, the encoder 126 may generate a particular parity bit of the parity data 167 based on a particular check equation of the check equations 174. The check equations 174 may correspond to a graph (e.g., a non-symmetric bipartite graph), as further described with reference to FIG. 2. The check equations 174 may be used by the encoder 126 to select values of parity bits that result in syndromes having a particular value (e.g., 0) based on the codeword 158. For example, the particular check equation may indicate that a particular syndrome is generated by applying a particular operation (e.g., an XOR operation) to the particular parity bit and one or more data bits of the data 164, the other data 165, or a combination thereof. The encoder 126 may generate the particular parity bit so that the particular syndrome has a particular value (e.g., 0) based on the particular check equation.

In a particular aspect, each bit (e.g., a bit 153) of the data 164 may participate in a larger number of the check equations 174 than each bit of the other data 165. For example, each bit (e.g., the bit 153) of the data 164 may be used to generate at least a first number of bits of the parity data 167 and each bit of the data 165 may be used to generate fewer than the first number of bits of the parity data 167. In some implementations, the encoder 126 may receive an indication from the access device 130 indicating that the data 164 is to participate in a larger number of the check equations 174, as further described with reference to FIG. 5. The controller 120 may provide the codeword 158 to the R/W circuitry 116. The R/W circuitry 116 may write the codeword 158 to the memory 190.

After the codeword 158 is written to the memory 190, the controller 120 may send a read request 136 to the R/W circuitry 116. For example, the controller 120 may send the read request 136 during a background maintenance operation. As another example, the controller 120 may receive a read request from the access device 130 indicating a logical address, as further described with reference to FIG. 4. The controller 120 may send the read request 136 in response to receiving the read request from the access device 130.

The controller 120 may, responsive to sending the read request 136 to the memory device 103, receive a representation 156 of the codeword 158 from the memory device 103. The representation 156 may differ from the codeword 158 due to one or more bit errors. The representation 156 may include a representation 160 of the data 164, a representation 155 of the other data 165, a representation 157 of the parity data 167, or a combination thereof. The decoder 128 may generate one or more syndromes 170 corresponding to the representation 156 of the codeword 158, as further described with reference to FIG. 3. A group 172 of the syndromes 170 may be associated with a bit 154. For example, each syndrome of the group 172 may be generated based at least in part on a value of the bit 154. The bit 154 may correspond to the bit 153. A first value of the bit 154 may be the same as a second value of the bit 153. A difference between the first value and the second value may indicate a bit-error. A second value (e.g., 1) of a particular syndrome of the syndromes 170 may indicate at least one bit-error in one or more associated bits of the representation 156. For example, the second value (e.g., 1) of a syndrome of the group 172 may indicate that a first value of the bit 154 differs from a second value of the bit 153.

The decoder 128 may, subsequent to generating the syndromes 170, perform the single decoding operation 166 on the representation 160 of the data 164 (and optionally on the representation 156 of the codeword 158). For example, the decoder 128 may determine a majority value of the group 172. To illustrate, the decoder 128 may determine that the majority value corresponds to a first value (e.g., 0) in response to determining that a majority of syndromes of the group 172 have the first value. Alternatively, the decoder 128 may determine that the majority value corresponds to a second value (e.g., 1) in response to determining that a majority of syndromes of the group 172 have the second value.

The decoder 128 may leave a value of the bit 154 of the representation 160 unchanged in response to determining that the majority value corresponds to the first value (e.g., 0). Alternatively, the decoder 128 may change (e.g., flip) the value of the bit 154 of the representation 160 in response to determining that the majority value corresponds to the second value (e.g., 1). For example, the decoder 128 may change the value of the bit 154 from a particular first value to a particular second value (e.g., from 1 to 0 or from 0 to 1) in response to determining that the majority value corresponds to the second value (e.g., 1).

The decoder 128 may determine whether the single decoding operation 166 has successfully decoded the representation 160 of the data 164, as described herein. In a particular aspect, the data 164 may indicate a physical address corresponding to a logical address. The decoder 128 may determine a second physical address based on the decoded representation 160 after performing the single decoding operation 166. The controller 120 may send a read request to the R/W circuitry 116 that indicates the second physical address. The R/W circuitry 116 may provide data stored at the second physical address to the controller 120, and the data read from the second physical address may include a second logical address. For example, header data stored at the second physical address may indicate the second logical address. In this aspect, the decoder 128 may determine whether the single decoding operation 166 is successful based on a comparison of the logical address and the second logical address. For example, the decoder 128 may determine that the single decoding operation 166 is successful in response to determining that the logical address matches the second logical address. In response to determining that the single decoding operation 166 is successful, the decoder 128 may provide decoded payload data from the second physical address to the access device 130, as further described with reference to FIG. 4. Alternatively, the decoder 128 may determine that the single decoding operation is unsuccessful in response to determining that the logical address (received from the access device 130) does not match the second logical address (read from the memory 190).

In a particular aspect, the decoder 128 may determine whether the single decoding operation 166 is successful based on performing a cyclic redundancy check (CRC) of the decoded representation 160 after performing the single decoding operation 166. For example, the data 164 may include a checksum portion. For example, the encoder 126 may generate the checksum portion based on a CRC algorithm. The decoder 128 may determine that the single decoding operation 166 is successful in response to determining that a result (e.g., remainder) of applying the CRC algorithm to the representation 160 has a first value (e.g., 0). Alternatively, the decoder 128 may determine that the single decoding operation 166 is unsuccessful in response to determining that the result has a second value (e.g., a non-zero value).

The decoder 128 may perform iterative LDPC decoding 168 on the representation 156 in response to determining that the single decoding operation 166 is unsuccessful. For example, the decoder 128 may change one or more bits of the representation 156 based on the syndromes 170. In a first iteration, the decoder 128 may update the syndromes 170 based on the representation 156 and update the representation 156 based on the syndromes 170. The decoder 128 may perform subsequent iterations until each of the syndromes 170 has a first value (e.g., 0), or until the decoding fails. For example, the decoder 128 may determine that the decoding has failed in response to determining that at least one of the syndromes 170 indicates a second value (e.g., 1) subsequent to performing a threshold number of iterations. Each of the syndromes 170 having the first value (e.g., 0) may indicate that the representation 156 corresponds to the codeword 158. One or more bit-errors in the representation 156 may thus be corrected by performing the iterative LDPC decoding 168.

The decoder 128 may perform a memory operation based on the representation 156 subsequent to performing the iterative LDPC decoding 168. For example, the decoder 128 may determine a physical address based on the representation 160 and may send a memory request to the R/W circuitry 116 indicating the physical address of data to be retrieved, as described with reference to FIG. 4.

Advantageously, the system 100 may enable the iterative LDPC decoding 168 to be performed selectively on the representation 156 based on a success of the single decoding operation 166. In cases in which the iterative LDPC decoding 168 is not performed, a latency associated with a memory operation that uses the data 164 may be reduced. For example, in these cases, the representation 160 may be updated (e.g., corrected) based on the syndromes 170 by performing the single decoding operation 166. The memory operation may be performed based on the representation 160. The single decoding operation 166 may be associated with a lower latency than the iterative LDPC decoding 168.

Referring to FIG. 2, illustrative aspects of the codeword 158 are shown. The check equations 174 may correspond to a graph (e.g., a non-symmetric bipartite graph), as described herein. Bits of the codeword 158 may correspond to a first set of nodes (e.g., "variable nodes") of the graph. The data 164 of the codeword 158 may include a bit 202 and the bit 153. The other data 165 may include a bit 204, a bit 206, and a bit 208. The parity data 167 may include a bit 210, a bit 212, a bit 214, and a bit 216.

Syndromes 290 may correspond to a second set of nodes (e.g., "check nodes") of the graph. The syndromes 290 may include a syndrome 218, a syndrome 220, a syndrome 222, and a syndrome 224. One or more of the codeword 158, the data 164, the other data 165, or the parity data 167 may include more than or fewer than the number of illustrated bits. The syndromes 290 may include more than four syndromes or fewer than four syndromes.

The graph may include a bipartite graph. For example, the first set of nodes may be disjoint from the second set of nodes. Each first node of the first set of nodes may be "connected" to at least one second node of the second set of nodes. Each second node of the second nodes may be connected to at least one first node of the first set of nodes. A first node of the first set of nodes may not be connected to another node of the first set of nodes. A second node of the second set of nodes may not be connected to another node of the second set of nodes. The graph may include a non-symmetric bipartite graph. For example, a first subset of the first set of nodes may be connected to at least a first number of the second set of nodes. Remaining nodes of the first set of nodes may be connected to fewer than the first number of the second set of nodes.

The check equations 174 may indicate connections between the first set of nodes and the second set of nodes.

For example, the check equations 174 may include a check equation 228 corresponding to the syndrome 218, a check equation 230 corresponding to the syndrome 220, a check equation 232 corresponding to the syndrome 222, and a check equation 234 corresponding to the syndrome 224.

The check equation 228 may indicate a connection from the syndrome 218 to each of the bit 202, the bit 153, the bit 206, and the bit 210. For example, the check equation 228 may indicate a bit-index 262 (e.g., 0) of the bit 202, a bit-index 284 (e.g., 1) of the bit 153, a bit-index 266 (e.g., 3) of the bit 206, and a bit-index 270 (e.g., 5) of the bit 210. The check equation 230 may indicate a connection from the syndrome 220 to each of the bit 202, the bit 153, the bit 204, and the bit 212. For example, the check equation 230 may indicate the bit-index 262 (e.g., 0) of the bit 202, the bit-index 284 (e.g., 1) of the bit 153, a bit-index 264 (e.g., 2) of the bit 204, and a bit-index 272 (e.g., 6) of the bit 212.

The check equation 232 may indicate a connection from the syndrome 222 to each of the bit 153, the bit 204, the bit 208, and the bit 214. For example, the check equation 232 may indicate the bit-index 284 (e.g., 1) of the bit 153, the bit-index 264 (e.g., 2) of the bit 204, a bit-index 268 (e.g., 4) of the bit 208, and a bit-index 274 (e.g., 7) of the bit 214. The check equation 234 may indicate a connection from the syndrome 224 to each of the bit 202, the bit 206, the bit 208 and the bit 216. For example, the check equation 234 may indicate the bit-index 262 (e.g., 0) of the bit 202, the bit-index 266 (e.g., 3) of the bit 206, the bit-index 268 (e.g., 4) of the bit 208, and a bit-index 276 (e.g., 8) of the bit 216.

Each bit of the data 164 may be associated with at least a first number of syndromes (or parity bits). For example, the check equations 174 may indicate that the bit 153 is associated with a group 292 of the syndromes 290. The group 292 may include the first number (e.g., 3) of syndromes (e.g., the syndrome 218, the syndrome 220, and the syndrome 222). The bit 153 may be associated with the first number (e.g., 3) of check equations (e.g., the check equation 228, the check equation 230, and the check equation 232). The bit 153 may be associated with the first number (e.g., 3) of parity bits (e.g., the bit 210, the bit 212, and the bit 214).

Each bit of the other data 165 may be associated with fewer than the first number of syndromes (or parity bits). For example, the check equations 174 may indicate that the bit 204 is associated with a second number (e.g., 2) of syndromes (e.g., the syndrome 220 and the syndrome 222), the second number of check equations (e.g., the check equation 230 and the check equation 232), and the second number of parity bits (e.g., the bit 212 and the bit 214).

During operation, the encoder 126 of FIG. 1 may generate the parity data 167 based on the data 164, the other data 165, and the check equations 174. For example, the encoder 126 may determine a value of the bit 210 based on the check equation 228. To illustrate, the encoder 126 may generate the value of the bit 210 by applying an operation (e.g., an XOR operation) to the bit 202, the bit 154, and the bit 206. The encoder 126 may determine a value of the bit 212 based on the check equation 230. For example, the encoder 126 may generate the value of the bit 212 by applying an operation (e.g., an XOR operation) to the bit 202, the bit 154, and the bit 204. The encoder 126 may determine a value of the bit 214 based on the check equation 232. For example, the encoder 126 may generate the value of the bit 214 by applying an operation (e.g., an XOR operation) to the bit 154, the bit 204, and the bit 208. The encoder 126 may determine a value of the bit 216 based on the check equation 234. For example, the encoder 126 may generate the value of the bit 216 by applying an operation (e.g., an XOR operation) to the bit 202, the bit 206, and the bit 208.

Because most bits of the codeword 158 remain uncorrupted upon retrieval from the memory 190, by having bits of the data 164 participate in a relatively large number of parity check equations, the encoder 126 increases the likelihood that bit errors in the data 164 may be corrected in a single decoding operation based on a majority of the syndromes in which each bit of the data 164 participates, as explained with reference to FIG. 3. In some implementations, "important" data may be included in the data 164 for faster decoding of the data as compared to other portions of the representation 156. For example, the representation 160 of the data 164 may be decoded and processed prior to performing iterative LDPC decoding to decode the representation 155 of the other data 165, the representation 157 of the parity data 167, or both. In some implementations, "important" data may be included in the data 164. For example, the representation 160 of the data 164 may be decoded by performing the single decoding operation. Other portions of the representation 156 may not be decoded or may be decoded selectively based on the decoded representation 160.

Figure 3:
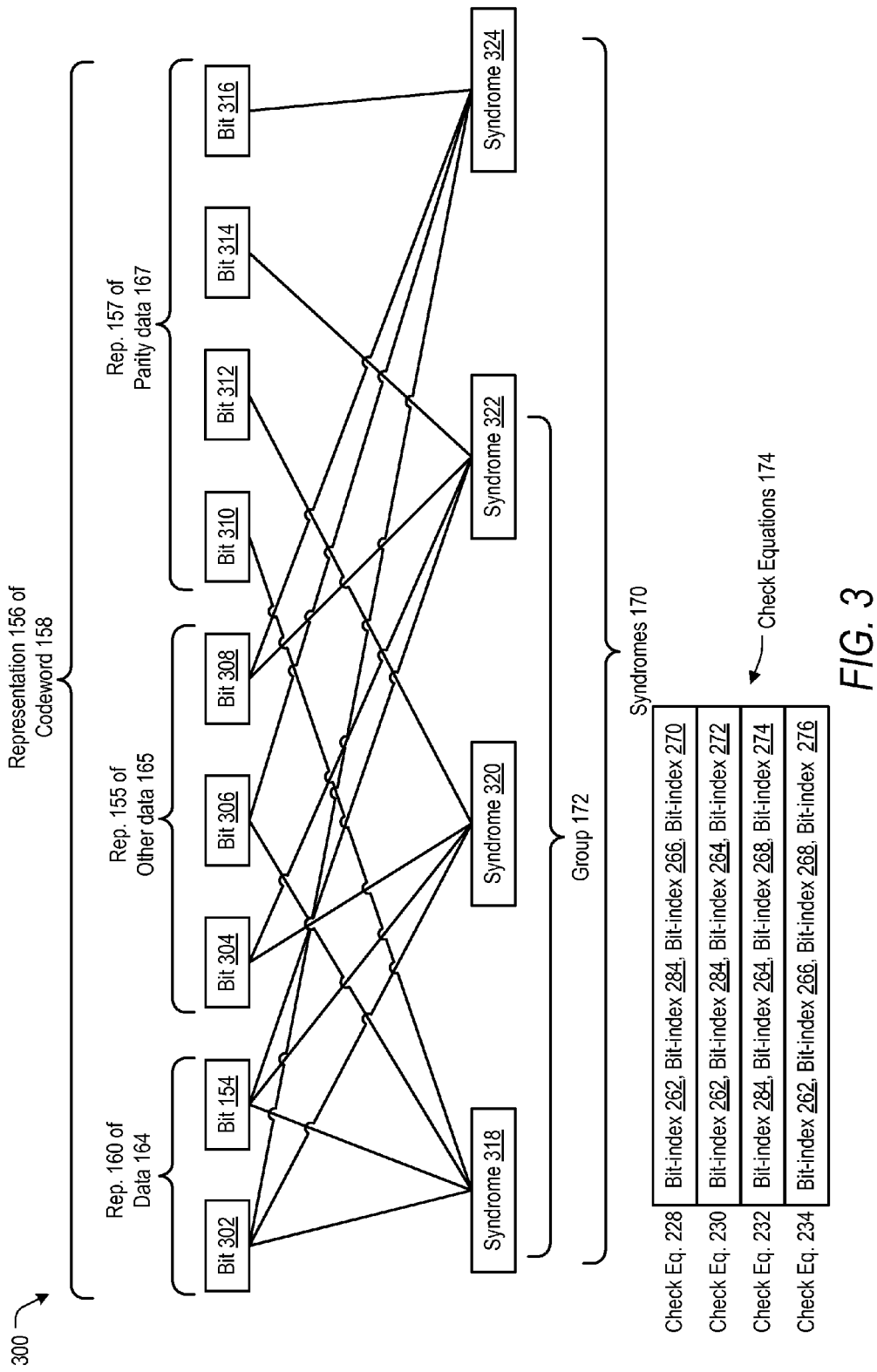
FIG. 3 is a diagram of a particular illustrative example of syndromes that may be generated by the device of FIG. 1.

Referring to FIG. 3, illustrative aspects of decoding the representation 156 are shown. The representation 160 of the data 164 may include a bit 302 and the bit 154. The bit 302 may correspond to the bit 202 of FIG. 2. For example, a first value of the bit 302 may be the same as a second value of the bit 202. A difference between the first value and the second value may indicate a bit-error. The bit 154 may correspond to the bit 153 of FIG. 1.

The representation 155 of the other data 165 may include a bit 304, a bit 306, and a bit 308. The bit 304 may correspond to the bit 204 of FIG. 2. The bit 306 may correspond to the bit 206 of FIG. 2. The bit 308 may correspond to the bit 208 of FIG. 2. The representation 157 of the parity data 167 may include a bit 310, a bit 312, a bit 314, and a bit 316. The bit 310 may correspond to the bit 210 of FIG. 2. The bit 312 may correspond to the bit 212 of FIG. 2. The bit 314 may correspond to the bit 214 of FIG. 2. The bit 316 may correspond to the bit 216 of FIG. 2.

During operation, the decoder 128 of FIG. 1 may generate the syndromes 170 based on the representation 156 of the codeword 158 and the check equations 174. For example, the decoder 128 may generate a number of syndromes corresponding to a count (e.g., 4) of the check equations 174. To illustrate, the decoder 128 may generate values of a syndrome 318 corresponding to the check equation 228, a syndrome 320 corresponding to the check equation 230, a syndrome 322 corresponding to the check equation 232, and a syndrome 324 corresponding to the check equation 234.

The decoder 128 may perform the single decoding operation 166 based on the syndromes 170. For example, the decoder 128 may update a value of a bit of the representation 156 based on a majority value of syndromes associated with the bit. To illustrate, the decoder 128 may determine that the bit 302 is associated with the syndrome 318, the syndrome 320, and the syndrome 324 based on the check equations 174. The decoder 128 may determine that a majority of the syndrome 318, the syndrome 320, and the syndrome 324 indicate a first majority value. The decoder 128 may leave a value of the bit 302 unchanged in response to determining that the first majority value corresponds to a first value (e.g., 0). Alternatively, the decoder 128 may change the value of the bit 302 in response to determining that the first majority value corresponds to a second value (e.g., 1). The second value (e.g., 1) may indicate a bit-error. Changing the value of the bit 302 may correct the bit-error.

The decoder 128 may similarly process subsequent bits of the representation 156. For example, the decoder 128 may determine that the bit 154 is associated with the group 172 based on the check equations 174. The decoder 128 may determine that a majority of the syndrome 318, the syndrome 320, and the syndrome 322 indicate a second majority value. The decoder 128 may leave a value of the bit 154 unchanged in response to determining that the second majority value corresponds to a first value (e.g., 0). Alternatively, the decoder 128 may change the value of the bit 154 in response to determining that the second majority value corresponds to a second value (e.g., 1).

During the single decoding operation 166, the decoder 128 may process bits of the representation 160, the representation 155, the representation 157, or a combination thereof. For example, in some implementations, the decoder 128 may process bits of the representation 160 and may refrain from processing bits of the representation 155, the representation 157, or both, during the single decoding operation 166.

The single decoding operation 166 may correct one or more bit-errors in the representation 160 based on the syndromes 170. Having bits of the representation 160 correspond to a greater number of syndromes may increase a likelihood that bit-errors in the representation 160 are corrected during the single decoding operation 166. The iterative LDPC decoding 168 may not be performed if the bit-errors in the representation 160 are corrected during the single decoding operation 166. The single decoding operation 166 may be associated with a lower latency than the iterative LDPC decoding 168. Refraining from performing the iterative LDPC decoding 168 may reduce a latency associated with decoding the representation 160.

Figure 4:
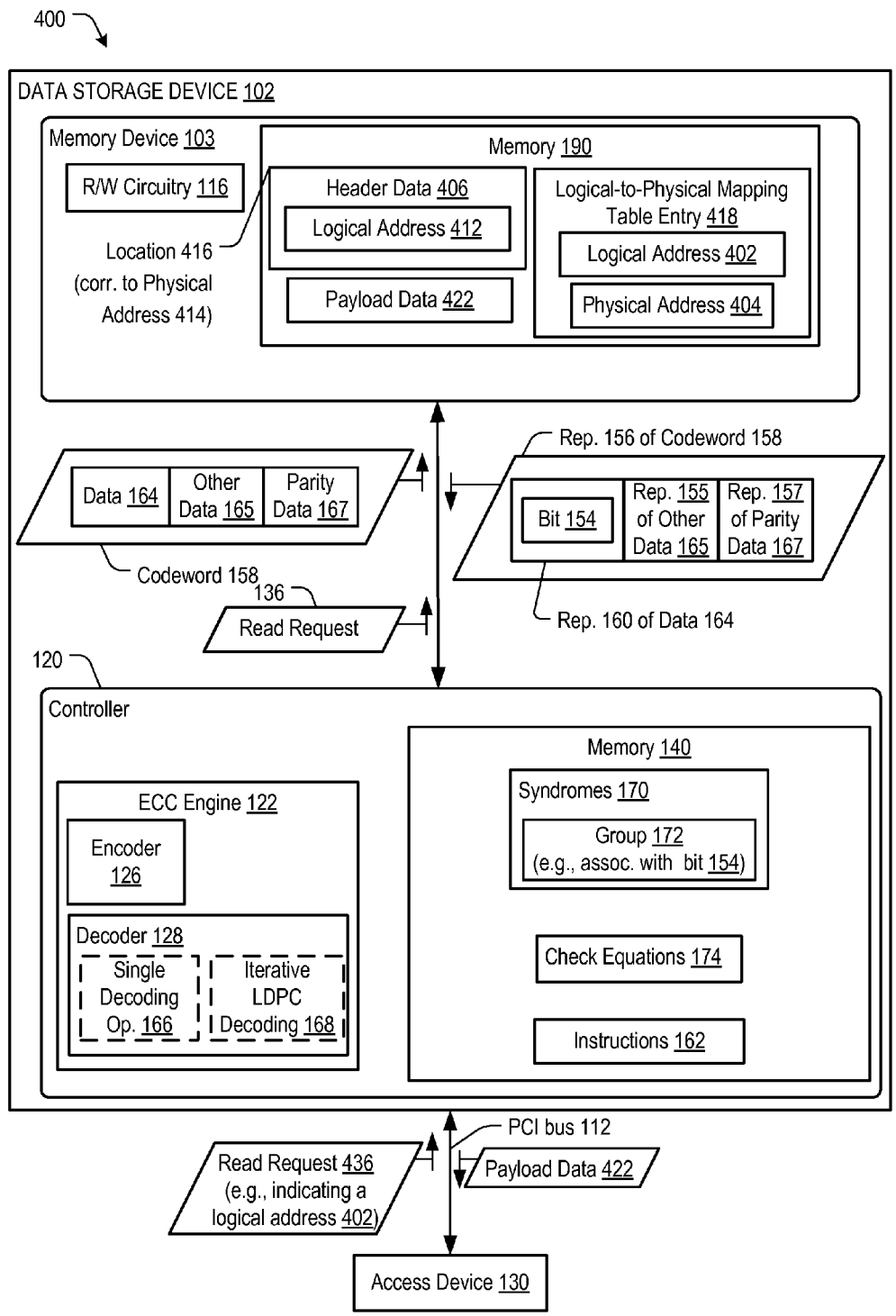
FIG. 4 is a diagram of a particular illustrative example of a system that includes the device of FIG. 1.

Referring to FIG. 4, a particular illustrative example of a system is depicted and generally designated 400. The memory 190 may store data (e.g., payload data 422). The memory 190 may also store supplemental data (e.g., header data 406) associated with the data (e.g., the payload data 422). The memory 190 may store the header data 406 and the payload data 422 at a location 416 corresponding to a physical address 414. The header data 406 may indicate a logical address 412 corresponding to the payload data 422 and that is mapped by the controller 120 to the physical address 414.

During operation, the controller 120 may receive a read request 436 from the access device 130. The read request 436 may indicate a logical address 402. The memory 190 may include a logical-to-physical mapping table entry 418. The logical-to-physical mapping table entry 418 may indicate that the logical address 402 maps to a physical address 404.

The decoder 128 may, in response to receiving the read request 436, send the read request 136 to the memory device 103. The R/W circuitry 116 may, in response to receiving the read request 136, send the representation 156 of the codeword 158 to the controller 120. The codeword 158 may include the data 164. The data 164 may correspond to the logical-to-physical mapping table entry 418. For example, the data 164 may indicate the physical address 404 that corresponds to the logical address 402.

The decoder 128 may generate the syndromes 170 based on the representation 156, as described with reference to FIGS. 1 and 3. The decoder 128 may perform the single decoding operation 166, as described with reference to FIGS. 1 and 3. Subsequent to performance of the single decoding operation 166, the representation 160 of the data 164 may indicate the physical address 414.

The decoder 128 may determine whether the single decoding operation 166 is successful. For example, the decoder 128 may send a read request to the memory device 103 indicating the physical address 414. The R/W circuitry 116 may, in response to receiving the read request from the decoder 128, read the header data 406 corresponding to the physical address 414. The R/W circuitry 116 may provide the logical address 412 to the controller 120. The decoder 128 may determine that the single decoding operation 166 is successful in response to determining that the logical address 412 matches the logical address 402. For example, the decoder 128 may decode the header data 406 to determine whether the logical address 412 matches the logical address 402. The decoder 128 may decode the header data 406 by performing the single decoding operation 166 on the header data 406. The logical address 412 matching the logical address 402 may indicate that the physical address 414 matches the physical address 404 of the logical-to-physical mapping table entry 418. The decoder 128 may decode the payload data 422 corresponding to the header data 406 (e.g., using the single decoding operation 166, the iterative LDPC decoding 168, or both). The decoder 128 may, in response to determining that the decoding of the payload data 422 is successful, send the decoded payload data 422 to the access device 130.

Alternatively, the decoder 128 may determine that the single decoding operation 166 is unsuccessful in response to determining that the logical address 412 does not match the logical address 402. The decoder 128 may perform the iterative LDPC decoding 168 of the logical-to-physical mapping table entry 418 in response to determining that the single decoding operation 166 is unsuccessful, as described with reference to FIG. 1. Subsequent to performance of the iterative LDPC decoding 168, the representation 160 of the data 164 may indicate the physical address 404. The decoder 128 may send a read request to the memory device 103 indicating the physical address 404. The R/W circuitry 116 may read payload data corresponding to the physical address 404 in response to receiving the read request from the decoder 128. The R/W circuitry 116 may provide the payload data to the controller 120. The decoder 128 may perform an error correction on the payload data prior to sending an error-corrected version of the payload data to the access device 130.

The system 400 may thus enable the decoder 128 to selectively perform the iterative LDPC decoding 168 based on determining whether the single decoding operation 166 is successful. In cases when the single decoding operation 166 is successful and the iterative LDPC decoding 168 is not performed, a latency associated with providing payload data to the access device 130 may be reduced.

Figure 5:
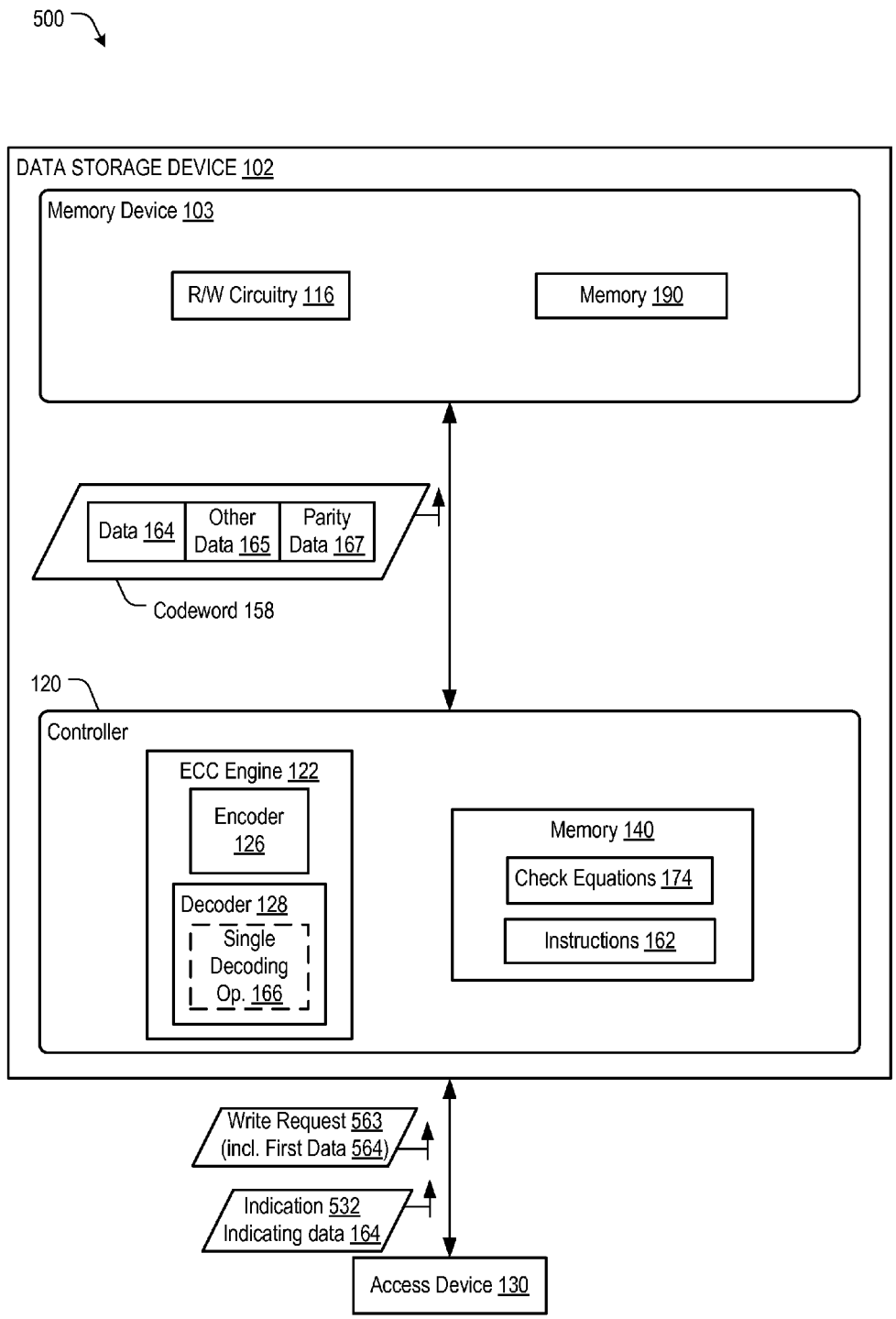
FIG. 5 is a diagram of another particular illustrative example of a system that includes the device of FIG. 1.

Referring to FIG. 5, a particular illustrative example of a system is depicted and generally designated 500. The system 500 differs from the system 100 in that the controller 120 receives an indication 532 from the access device 130. The indication 532 may indicate the data 164. For example, the indication 532 may indicate that each bit of the data 164 is to participate in a greater number of the check equations 174 than other data (e.g., the other data 165 of FIG. 1).

The controller 120 may receive the indication 532 from the access device 130 in conjunction with a write request 563. The write request 563 may include first data 564. The data 164 may be associated with the first data 564. For example, the data 164 may correspond to the logical-to-physical mapping table entry 418 of FIG. 4 and the first data 564 may correspond to payload data (e.g., the payload data 422). In this example, the indication 532 may indicate that a logical-to-physical mapping table entry (e.g., the logical-to-physical mapping table entry 418) corresponding to the first data 564 is to participate in a greater number of the check equations 174. The encoder 126 may generate the codeword 158 so that each bit of the data 164 participates in a greater number of check equations 174 than each bit of the other data 165. For example, each bit of the data 164 may be used to generate at least a first number of bits of the parity data 167 and each bit of the other data 165 may be used to generate fewer than the first number of bits of the parity data 167, as described with reference to FIGS. 1-2.

The system 500 may thus enable the encoder 126 to generate the codeword 158 based on an indication from the access device 130 that indicates which bits are to be used to generate a greater number of parity bits. There may be a higher likelihood that bit-errors in representations of the indicated bits are corrected when performing the single decoding operation 166.

Figure 6:
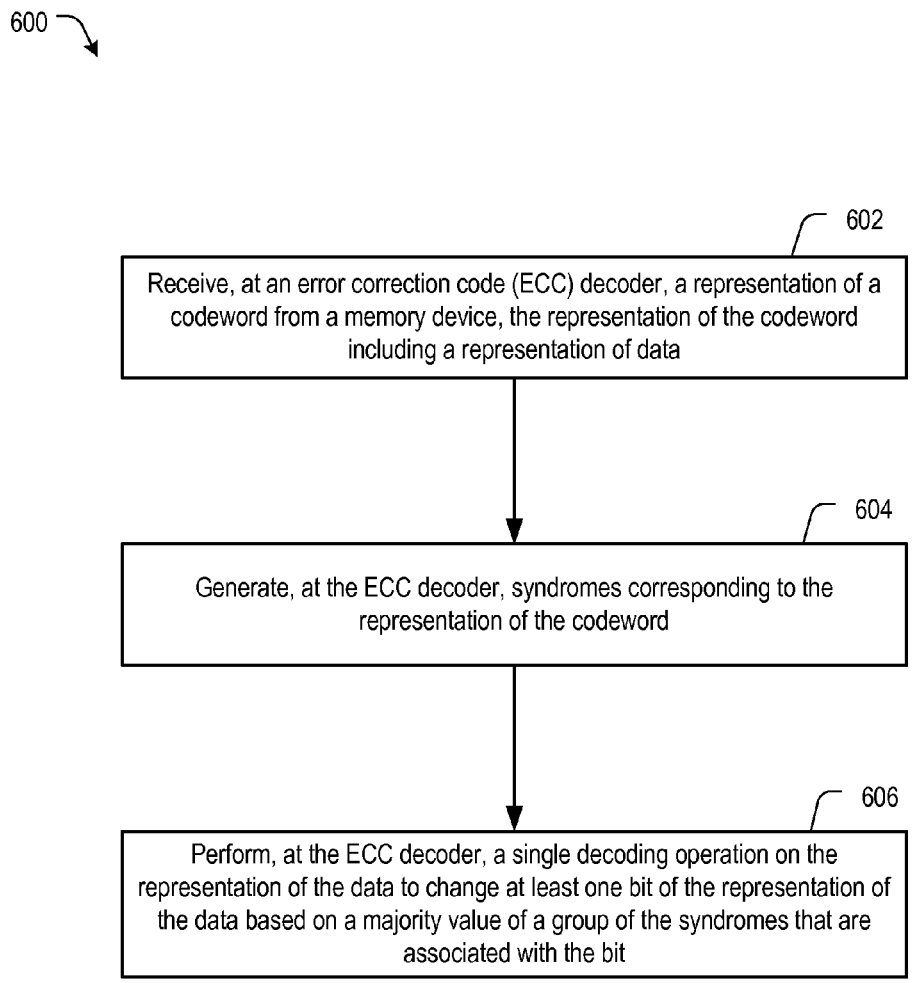
FIG. 6 is a diagram of a particular illustrative example of a method of operation of the device of FIG. 1.

Referring to FIG. 6, an illustrative example of a method is depicted and generally designated 600. The method 600 may be performed by the controller 120, the ECC engine 122, the decoder 128 of FIG. 1, or a combination thereof.

The method 600 includes receiving, at an error correction code (ECC) decoder, a representation of a codeword from a memory device, at 602. For example, the controller 120 of FIG. 1 may receive the representation 156 of the codeword 158 from the memory device 103, as described with reference to FIG. 1. The representation 156 may include the representation 160 of the data 164.

The method 600 also includes generating, at the ECC decoder, syndromes corresponding to the representation of the codeword, at 604. For example, the decoder 128 may generate the syndromes 170 corresponding to the representation 156 of the codeword 158, as described with reference to FIGS. 1 and 3.

The method 600 further includes performing, at the ECC decoder, a single decoding operation on the representation of the data to change at least one bit of the representation of the data based on a majority value of a group of the syndromes that are associated with the bit, at 606. For example, the decoder 128 may perform the single decoding operation 166 on the representation 160 of the data 164, as described with reference to FIGS. 1 and 3. During the single decoding operation 166, at least one bit (e.g., the bit 154) of the representation 160 of the data 164 may be changed based on a majority value of the group of the syndromes (e.g., the group 172) that are associated with the bit (e.g., the bit 154).

The method 600 may enable the decoder 128 to correct one or more bit errors in the representation 160 of the data 164 based on the syndromes 170 during the single decoding operation 166. In cases where the single decoding operation 166 is successful, a latency associated with decoding the data 164 may be reduced by performing the single decoding operation 166 as compared to performing the iterative LDPC decoding 168.

In some implementations, a computer-readable medium stores instructions executable by a processing module to perform operations. For example, the computer-readable medium may correspond to the memory 140, the instructions may correspond to the instructions 162, and the processing module may correspond to the ECC engine 122, the encoder 126, the decoder 128, or a combination thereof. The operations include receiving a representation (e.g., the representation 156) of a codeword (e.g., the codeword 158) from a memory device (e.g., the memory device 103). The representation (e.g., the representation 156) is received responsive to a request (e.g., the read request 136) for the data (e.g., the data 164). The representation (e.g., the representation 156) includes a representation (e.g., the representation 160) of the data (e.g., the data 164). The operations also include generating, at an ECC decoder (e.g., the decoder 128), syndromes (e.g., the syndromes 170) corresponding to the representation (e.g., the representation 156) of the codeword (e.g., the codeword 158). The operations further include performing a single decoding operation (e.g., the single decoding operation 166) of the representation (e.g., the representation 160) of the data (e.g., the data 164). At least one bit (e.g., the bit 154) of the representation (e.g., the representation 160) of the data (e.g., the data 164) is changed based on a majority value of a group of the syndromes (e.g., the group 172) that are associated with the bit (e.g., the bit 154).

Although various components depicted herein are illustrated as block components and described in general terms, such components may include one or more microprocessors, state machines, or other circuits configured to enable such components to perform one or more operations described herein. For example, the ECC engine 122, the encoder 126, the decoder 128, or a combination thereof, may represent physical components, such as hardware controllers, state machines, logic circuits, or other structures, to enable the controller 120 to receive the representation 156 of the codeword 158, to generate the syndromes 170, and to perform the single decoding operation 166.

Alternatively or in addition, one or more components described herein may be implemented using a microprocessor or microcontroller programmed to perform operations, such as one or more operations of the method 600 of FIG. 6. Instructions executed by the encoder 126, the decoder 128, the ECC engine 122, the controller 120 and/or the data storage device 102 may be retrieved from the memory 140 or from a separate memory location that is not part of the memory 140, such as from a read-only memory (ROM).

The data storage device 102 may be coupled to, attached to, or embedded within one or more accessing devices, such as within a housing of the access device 130. For example, the data storage device 102 may be embedded within the access device 130 in accordance with a Joint Electron Devices Engineering Council (JEDEC) Solid State Technology Association Universal Flash Storage (UFS) configuration. To further illustrate, the data storage device 102 may be integrated within an electronic device, such as a mobile telephone, a computer (e.g., a laptop, a tablet, or a notebook computer), a music player, a video player, a gaming device or console, a component of a vehicle (e.g., a vehicle console), an electronic book reader, a personal digital assistant (PDA), a portable navigation device, or other device that uses internal non-volatile memory.

In one or more other implementations, the data storage device 102 may be implemented in a portable device configured to be selectively coupled to one or more external devices, such as a host device. For example, the data storage device 102 may be removable from the access device 130 (i.e., "removably" coupled to the device). As an example, the data storage device 102 may be removably coupled to the access device 130 in accordance with a removable universal serial bus (USB) configuration.

In some implementations, the system 100, the data storage device 102, or the memory 140 may be integrated within a network-accessible data storage system, such as an enterprise data system, an NAS system, or a cloud data storage system, as illustrative examples. In some implementations, the data storage device 102 may include a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the access device 130 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the access device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 140 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the data storage device 102 is indirectly coupled to the access device 130 via a network. For example, the data storage device 102 may be a network-attached storage (NAS) device or a component (e.g., a solid-state drive (SSD) component) of a data center storage system, an enterprise storage system, or a storage area network. The memory 140 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
   a memory device; and
   an error correction code (ECC) decoder coupled to the memory device, the ECC decoder configured to generate syndromes corresponding to a representation of a codeword received from the memory device and to perform a single decoding operation on a representation of data included in the representation of the codeword, wherein the single decoding operation is configured to change at least one bit of the representation of the data based on a majority value of a group of the syndromes that are associated with the bit and to process each bit of the codeword at most once during the single decoding operation.

2. The device of claim 1, wherein the ECC decoder is further configured to, in response to determining that the single decoding operation is unsuccessful, perform iterative low-density parity check (LDPC) decoding on the representation of the codeword.

3. The device of claim 1, wherein the ECC decoder is further configured to determine whether the single decoding operation is successful based on performing a cyclic redundancy check of the data.

4. The device of claim 1, wherein the data corresponds to header data.

5. The device of claim 1, wherein the data corresponds to a logical-to-physical mapping table entry.

6. The device of claim 1, wherein the ECC decoder is included in a controller configured to receive a request for the data from a host device.

7. A method comprising:
   receiving, at an error correction code (ECC) decoder, a representation of a codeword from a memory device, the representation of the codeword including a representation of data;
   generating, at the ECC decoder, syndromes corresponding to the representation of the codeword; and
   performing, at the ECC decoder, a single decoding operation on the representation of the data, the single decoding operation configured to change at least one bit of the representation of the data based on a majority value of a group of the syndromes that are associated with the bit and to process each bit of the codeword at most once during the single decoding operation.

8. The method of claim 7, wherein parity bits of the codeword are generated based on the data and based on second data, and wherein, during encoding of the codeword, each bit of the data is used to generate at least a first number of the parity bits and each bit of the second data is used to generate fewer than the first number of the parity bits.

9. The method of claim 7, further comprising, in response to determining that the single decoding operation is unsuccessful, performing iterative low-density parity check (LDPC) decoding on the representation of the codeword.

10. The method of claim 7, further comprising:
    subsequent to performing the single decoding operation, determining a physical address based on the data, wherein the data corresponds to a logical-to-physical mapping table entry corresponding to a logical address;
    reading header data from a location in the memory device corresponding to the physical address, the header data indicating a second logical address; and
    determining whether the single decoding operation is successful based the logical address and the second logical address.

11. The method of claim 10, further comprising determining that the single decoding operation is successful in response to determining that the logical address matches the second logical address.

12. The method of claim 10, further comprising determining whether the single decoding operation is successful based on performing a cyclic redundancy check of the data.

13. A device comprising:
    a memory device; and
    an error correction code (ECC) engine that includes an encoder and a decoder,
    wherein the decoder is configured to perform a single decoding operation on a representation of data associated with a codeword, wherein the single decoding operation is configured to change at least one bit of the representation of the data based on a majority value of a group of syndromes that are associated with the bit and to process each bit of the codeword at most once during the single decoding operation, and
    wherein the encoder is configured to encode a portion of first data based on an indication of the portion of the first data and to write the encoded portion of the first data to the memory device, wherein the first data and the indication are received from an access device, wherein at least a first number of parity bits are generated based on each bit of the portion of the first data, and wherein fewer than the first number of the parity bits are generated based on each bit of other portions of the first data, and wherein the encoded portion of the first data is decodable by the single decoding operation.

14. The device of claim 13, wherein the memory device includes a non-volatile memory, wherein the ECC engine is included in a controller, and wherein the encoder is further configured to encode the portion of the first data by generating the codeword.

15. The device of claim 14, wherein the codeword includes the first data and the parity bits, wherein the decoder is further configured to, in response to determining that the single decoding operation of the encoded portion of the first data is unsuccessful, perform iterative low-density parity check (LDPC) decoding on a representation of the codeword.

16. The device of claim 13, wherein the portion of the first data is encoded based on a non-symmetric bipartite graph.

17. The device of claim 13, wherein the first data corresponds to a logical-to-physical mapping table entry.

18. The device of claim 13, wherein the first data corresponds to header data.

19. An apparatus comprising:
    means for storing data; and
    means for decoding data, the means for decoding data configured to generate syndromes corresponding to a representation of a codeword received from the means for storing data and to perform a single decoding operation on a representation of data included in the representation of the codeword,
    wherein the single decoding operation is configured to change at least one bit of the representation of the data based on a majority value of a group of the syndromes associated with the bit and to process each bit of the codeword at most once during the single decoding operation.

20. The apparatus of claim 19, wherein the means for decoding data is further configured to, in response to determining that the single decoding operation is unsuccessful, perform iterative low-density parity check (LDPC) decoding on the representation of the codeword.

* * * * *